United States Patent [19]

Purdes et al.

[11] Patent Number: 5,082,522
[45] Date of Patent: Jan. 21, 1992

[54] METHOD FOR FORMING PATTERNED DIAMOND THIN FILMS

[75] Inventors: Andrew J. Purdes, Garland; Francis G. Celii, Dallas, both of Tex.

[73] Assignee: Texas Instruments Incorporated, Dallas, Tex.

[21] Appl. No.: 567,423

[22] Filed: Aug. 14, 1990

[51] Int. Cl.$^5$ .............................. C30B 25/06
[52] U.S. Cl. .................. 156/612; 156/613; 156/614; 423/446
[58] Field of Search ............ 156/612, 613, 614; 423/446

[56] References Cited

U.S. PATENT DOCUMENTS 4,380,489 4/1983 Beinvogl et al. .............. 156/643
4,740,263 4/1988 Imai et al. ................ 156/DIG. 68

FOREIGN PATENT DOCUMENTS 0288065 10/1988 European Pat. Off. ......... 423/446
1036112 2/1986 Japan ......................... 423/446
63-303891 12/1988 Japan .
0240049 12/1989 Japan .

OTHER PUBLICATIONS

"Crystallization of Diamond Crystals and Films. by Microwave Assisted CVD, Part II", Mater Res. Bull, 23(4), pp. 531-548.

Primary Examiner—Robert Kunemund
Assistant Examiner—Felisa C. Garrett
Attorney, Agent, or Firm—Melvin Sharp; James T. Comfort; N. Rhys Merrett

[57] ABSTRACT

Preferred embodiments mask select regions of a circuit surface (141) prior to abrading the surface with diamond particles to form nucleation sites (200). The mask (150) is then removed prior to forming a diamond layer (160). Diamond layer (160) grows on the surface except in those regions wherein the mask (150) prevented the formation of nucleation sites (200).

20 Claims, 3 Drawing Sheets

METHOD FOR FORMING PATTERNED DIAMOND THIN FILMS

BACKGROUND OF THE INVENTION

1. Field of the Invention

The present invention relates to growth of films of material, and, more particularly, to the growth of diamond-type films and related devices.

2. Description of the Related Art

Diamond is a useful industrial material, combining the desirable properties of electrical non-conductance along with high thermal conductance. These properties make diamond a good candidate material for isolating circuit levels in multilevel circuit boards.

A method for forming a continuous diamond film is disclosed in co-pending application, Ser. No. 231,750 filed Aug. 12, 1988 now U.S. Pat. No. 5,006,203. In the disclosed method, diamond film is grown in a multistep process: the first step grows a film under conditions yielding good film coverage of a diamondlike layer; this diamondlike layer is then etched with atomic hydrogen to preferentially remove graphitic-bonded material, resulting in a primarily diamond-bonded surface; the final step grows a film under conditions yielding a high quality diamond layer. The diamondlike layer provides a high nucleation density for diamond growth, resulting in a high quality diamond layer.

However, also needed in order to use diamond as an interlevel insulator, is a method of forming a patterned diamond film containing vias for interconnecting the circuit levels. Because of the chemical inertness of diamond it is difficult to etch the required vias.

Known methods of patterned diamond film growth rely upon destruction of previously formed diamond nucleation sites. Discrete diamond particles have been formed in a patterned array on a silicon substrate by use of a silicon dioxide shadow mask. This is accomplished by forming diamond nucleation sites over the entire surface of the silicon-dioxide-masked silicon substrate. The entire substrate is then irradiated with an oblique Ar ion beam which selectively reduces the number of nucleation sites. This process is limited to growing particles on one edge of the silicon dioxide site. See Ma et al, Selective nucleation and growth of diamond particles by plasma-assisted chemical vapor deposition, 55 (11) Appl. Phys. Lett. 1071, 1989.

SUMMARY OF THE INVENTION

The present invention provides a method of forming a patterned diamond film and devices fabricated by this method: the first step involves forming a pattern mask on the areas where the diamond film is not to be grown; the second step is to "seed" the surface to provide diamond nucleation sites; the third step is to remove the pattern mask; and the final step is to grow a diamond film, the film growing only on those areas of the surface which were seeded with nucleation sites, that is which were not covered by the pattern mask.

Preferred embodiments include forming vias in a diamond film which is used as an interlevel insulator between multilevel circuit layers. This is accomplished by masking the regions of the vias prior to forming nucleation sites to prevent nucleation sites from forming in those regions, and removing the mask prior to the diamond growth, thus providing a surface with high nucleation density except for the regions which were covered by the mask.

This invention avoids the difficult process of etching through the chemically inert diamond film. By forming nucleation sites in only select regions, the diamond film is formed in those regions only, thus eliminating the necessity of etching, or otherwise removing the film from non-selected regions.

DESCRIPTION OF THE PREFERRED EMBODIMENTS

A first preferred embodiment method of growing a patterned diamond film is schematically illustrated in cross sectional elevation views in FIGS. 1a–e.

Figure 1A:
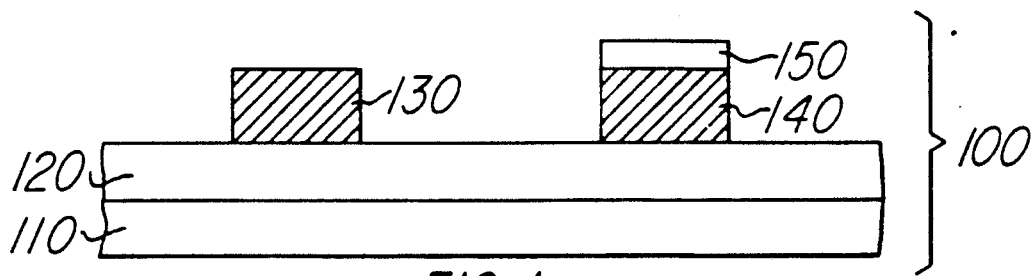
FIGS. 1a–e are schematic cross sectional elevation views of steps of a first preferred embodiment method of patterned diamond film growth.

In FIG. 1a diamond layer 120 is used as an insulator between silicon substrate 110 and conductive copper lines 130 and 140. In a first preferred embodiment it is desired to insulate line 130 from conductive lines subsequently formed over lines 130 and 140. It is also desirable to provide electrical connection between line 140 and a subsequently formed conductive line. Photomask layer 150 is formed over line 140 using conventional photomask techniques, such as spinning on and photolithographically exposing an organic photomask material. Photomask layer 150 is typically about 1 $\mu$m thick.

Figure 1B:
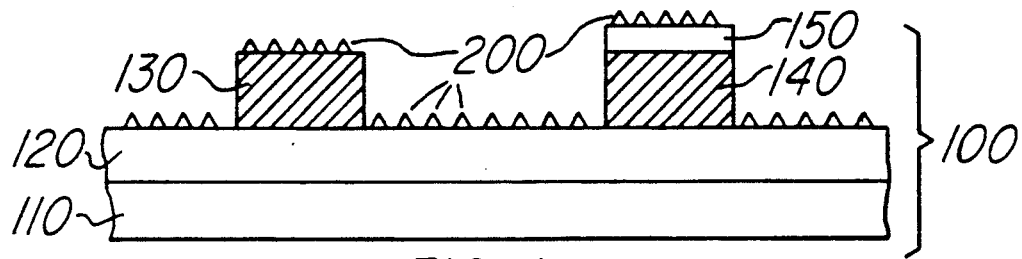

FIG. 1b illustrates the result of forming or "seeding" nucleation sites 200. This is accomplished by abrading the surface of the circuit with a fine diamond grit. The abrasion can be performed by suspending the diamond grit, with a nominal particle size of about 1 micron, in a slurry and polishing the surface of the circuit structure with this slurry. Small diamond particles are imbedded in the surface as a result of the abrasion and these particles form nucleation sites 200 for subsequent diamond film growth. Typical nucleation site densities of the order of $10^8$ to $10^9$ particles/cm$^2$ are achieved by the abrasion process. Note that because line 140 is covered by photomask layer 150, line 140 is not abraded. Line 130, on the other hand, is exposed to the abrasion process. After abrading, the surface is cleaned by ultrasonic treatment in a non-organic solvent such as distilled water to remove loose particles of diamond powder.

Figure 1C:
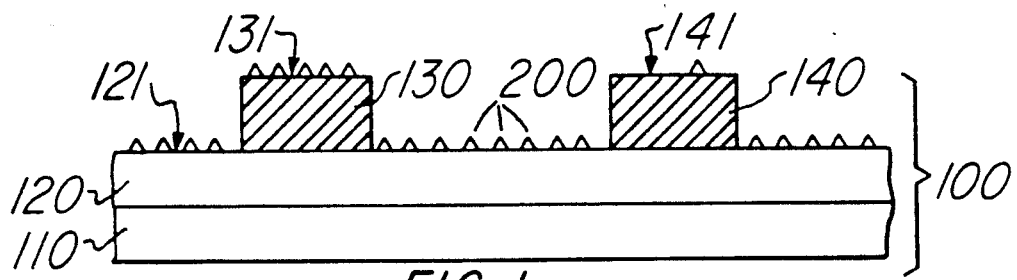

Following the formation of nucleation sites 200, photomask layer 150 is removed by exposure to an organic solvent which dissolves the photomask layer. This also removes nucleation sites 200 which were formed on photomask layer 150, as shown in FIG. 1c. Therefore, those regions of surface 141 which were covered by photomask layer 150 are substantially free of diamond nucleation sites. In contrast, surfaces 121 and 131, which were not covered by photomask layer 150, and were hence exposed to the diamond grit abrasion, have a high density of nucleation sites. The result is a surface with a high density of nucleation sites 200 in those regions where diamond growth is desired, and with very low density of nucleation sites where diamond growth is not desired.

Figure 1D:
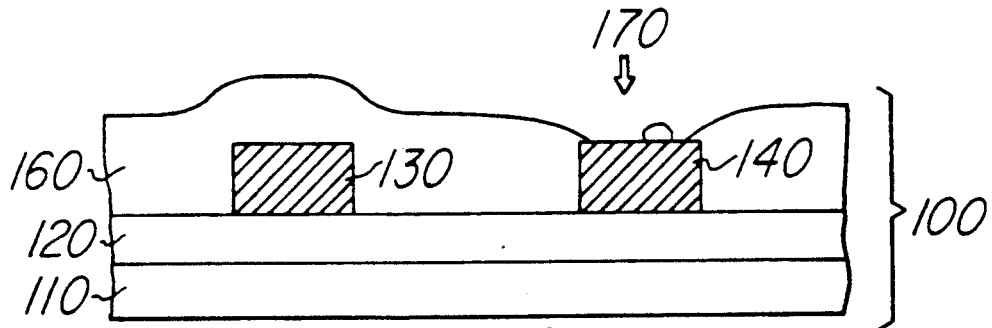
Figure 2:
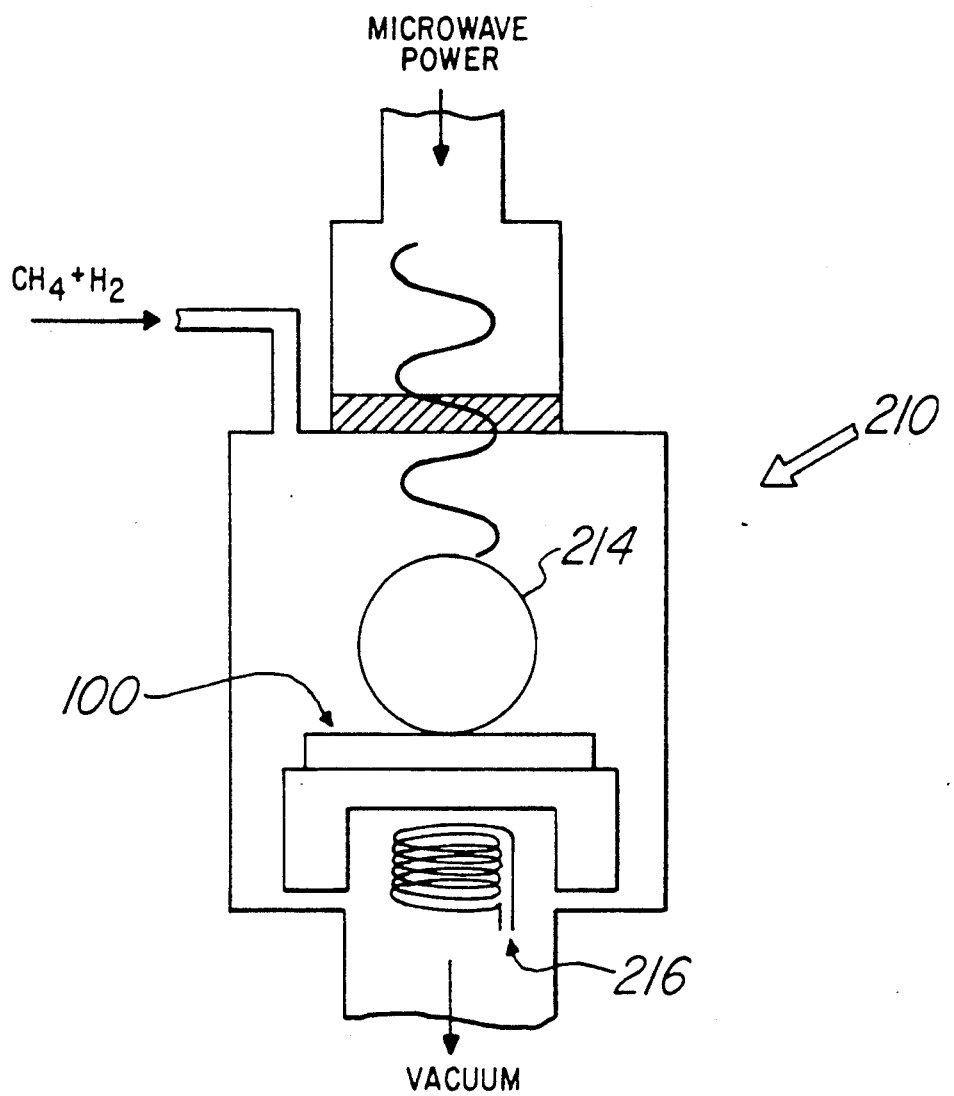
FIG. 2 is a schematic cross sectional elevation view of a reactor for diamond film growth.

Following the removal of photomask 150 and subsequent wash, the circuit structure is subjected to diamond growth conditions, as follows:

Circuit structure 100 is inserted into a diamond deposition reactor, such as the microwave plasma deposition reactor 210 shown in FIG. 2. Reactor 210 is evacuated and circuit structure 100 is heated to a temperature of about 800 C. with either microwave plasma 214, substrate heater 216, or both. A gaseous flow of about 100 sccm of 1% methane in hydrogen is then introduced into the reactor at a pressure of about 30 Torr. The microwave plasma is generated by the action of about 1 kW, 2.45 GHz microwave power into reactor 210. These conditions are suitable for the growth of high quality diamond layer 160, as shown in FIG. 1d. The high density of nucleation sites 200 on surface 121 of layer 120 and surface 131 of line 130 ensures that diamond layer 160 will grow uniformly over these surfaces. The growth rate of the diamond layer is about 1 micron/hour. The low density of nucleation sites 200 on surface 141 of line 140 ensures that only scattered diamond particles will form on the surface. This results in via 170 in diamond film 160 through which conductive line 140 can be electrically connected to subsequently formed conductive lines. Further, conductive line 130 is electrically insulated by diamond film 160 from any subsequently formed conductive lines.

Figure 1E:
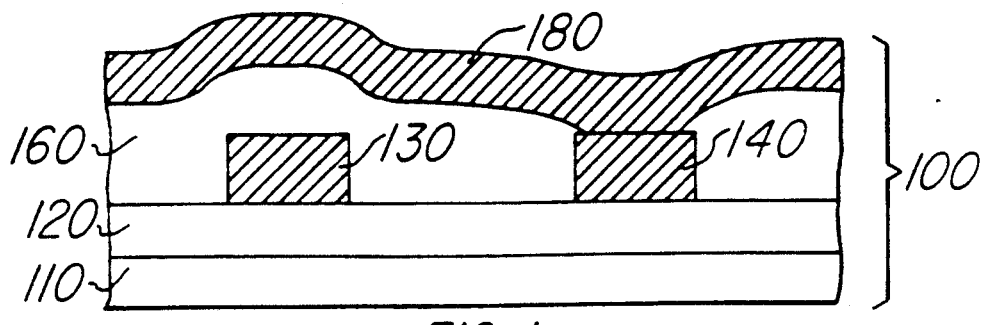

FIG. 1e illustrates the use of via 170 in interconnecting line 140 and subsequently formed conductive line 180. Line 180 is formed by sputter deposition or other standard metal deposition techniques. Line 180 is electrically isolated from underlying line 130 by diamond layer 160. However, line 180 is in electrical contact to line 140 through via 170, which is formed during the growth of diamond layer 160.

In a second preferred embodiment, a patterned silicon dioxide layer is used as the masking layer for patterning the formation of nucleation sites.

Figure 3A:
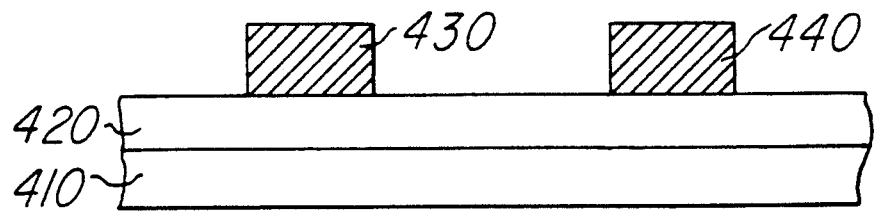
FIGS. 3a–e are schematic cross sectional elevation views of steps of a second preferred embodiment method of patterned diamond film growth.
Figure 3B:
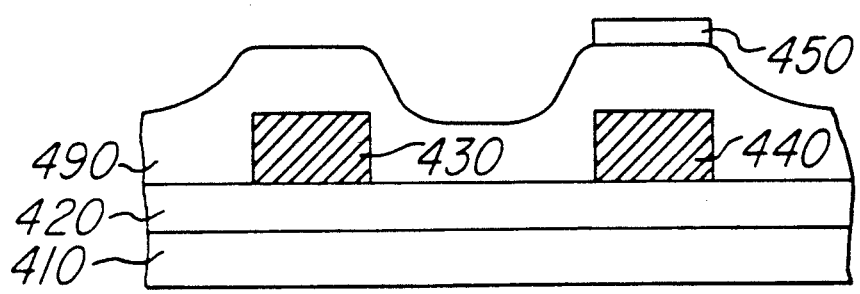
Figure 3C:
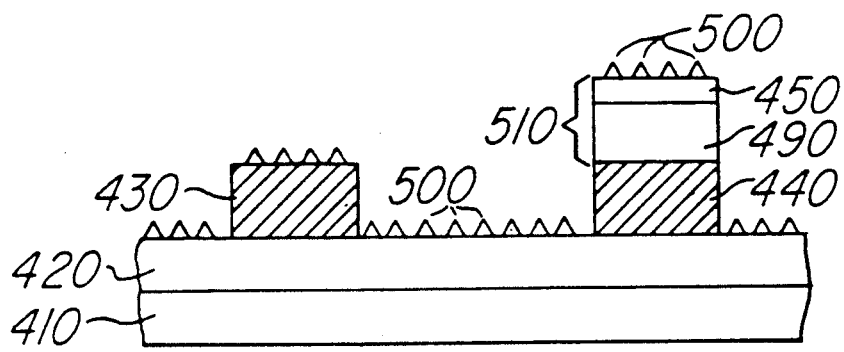

FIG. 3a diamond layer 420 has been formed on silicon substrate 410. Copper lines 430 and 440 have been formed on diamond layer 420. It is desired to make electrical contact to line 440 with a subsequently formed conductive line, while electrically isolating line 430 from the subsequently formed line. As shown in FIG. 3b, silicon dioxide layer 490 is formed on the entire surface of the circuit by a method such as chemical vapor deposition (CVD). Silicon dioxide layer is preferentially about 1 μm thick. This is followed by depositing photomask layer 450 through spin-on or other well known techniques, and photographically forming a pattern in photomask layer 450. Photomask layer 450 is then used as a mask for pattern etching of silicon dioxide layer 490. This results in masking layer 510, consisting of photomask layer 450 and silicon dioxide layer 490, which covers those regions of line 440 on which it is desired not to grow a diamond film. Nucleation sites are then formed by the abrasion process as described in the first preferred embodiment. The addition of silicon dioxide layer 490 to masking layer 510 decreases the possibility of unwanted nucleation sites within the via regions due to imperfect coverage of the masking layer or due to punch-through of the masking layer during the abrasion process, as shown in FIG. 3c.

Figure 3D:
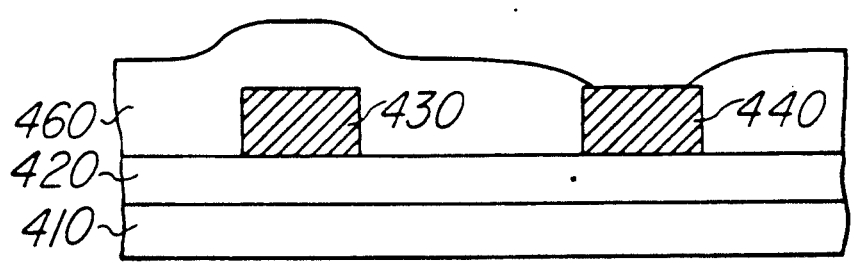

Masking layer 510 is subsequently etched away, and the nucleation sites formed on masking layer are also removed in the etch, thus exposing line 440, which remains substantially nucleation site free. Diamond film 460 is then formed by the method described in the first preferred embodiment, as shown in FIG. 3d.

Figure 3E:
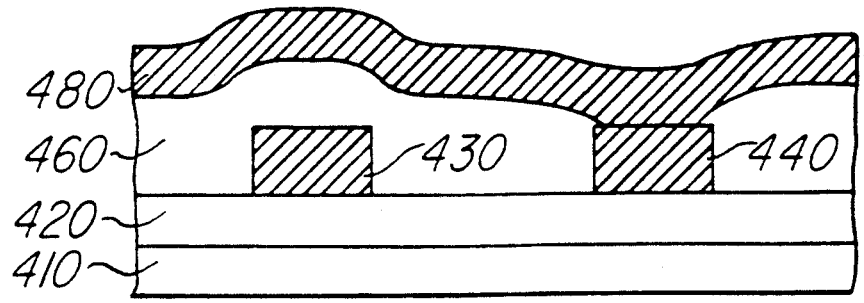

Finally, conductive layer 480 is deposited onto the surface of the circuit, electrically isolated from line 430 by diamond film 460, and electrically connected to line 440 through the via formed in the diamond film during growth, as shown in FIG. 3e.

MODIFICATIONS AND ADVANTAGES

Various modifications of the preferred embodiment methods may be made while retaining the features of a using a masking process to form a patterned layer of nucleation sites for diamond layer growth. For example, abrasion may occur by ultrasonic treatment or by particle bombardment. Various substrate materials, other than silicon, may be used, such as quartz or copper or other metals. Hot filament or microwave discharge processes may be used in place of the microwave plasma process described in the preferred embodiments for the growth of the diamond layer. Also, other hydrocarbons or other carbon-bearing materials, such as ethanol, may be used at least partially substituted for the methane.

The invention provides a method of forming patterned diamond films with the advantage of not needing to etch diamond or use other diamond removal techniques, by avoiding nucleation sites from those regions where diamond growth is not desired. These patterned films allow for good electrical isolation and thermal conductance, along with the ability to make electrical contact to select points underlying the diamond film.

What is claimed is:

1. A method of forming a patterned diamond film on a body, comprising the steps of:
    (a) forming a masking layer on a portion of said body;
    (b) forming nucleation sites only on select regions of said body;
    (c) then removing said masking layer; and
    (d) then forming a diamond film on said select regions of said body.

2. The method of claim 1, wherein:
    (a) said forming of nucleation sites on select regions is accomplished by abrading said select regions with diamond particles.

3. The method of claim 1, wherein:
    (a) said forming of said diamond film is by microwave decomposition of carbon-bearing material plus hydrogen.

4. A method of forming a patterned diamond film on a body, comprising the steps of:
    (a) forming a masking layer on said body; said masking layer leaving select regions of said body exposed;
    (b) forming nucleation sites by abrading said masking layer and said select regions of said body with diamond grit;
    (c) removing said abraded masking layer; and
    (d) then forming a diamond film on said select regions of said body.

5. The method of claim 4, wherein:
    (a) said forming a masking layer is by photolithographic development of an organic photomask layer.

6. The method of claim 4, wherein:
    (a) said forming of said diamond film is by microwave decomposition of carbon-bearing material and hydrogen.

7. A method of forming a patterned diamond film, comprising the steps of:
  (a) forming a first layer of diamond on a semiconductor body;
  (b) forming a first layer of conducting material on said first layer of diamond;
  (c) forming a masking layer on said first layer of conducting material; said masking layer leaving select regions of said first layer of conducting material exposed;
  (d) abrading said select regions of said first layer of said conducting material and said masking layer with diamond grit;
  (e) removing said masking layer;
  (f) forming a second layer of diamond on said select regions; and
  (g) forming a second layer of conducting material on said second layer of diamond.

8. The method of claim 7, wherein:
  (a) said conducting material is formed of substantially copper.

9. The method of claim 7, wherein:
  (a) said masking layer is an organic photomask material.

10. The method of claim 7, wherein:
  (a) said masking layers comprises an organic photomask material and silicon dioxide.

11. The method of claim 7, wherein:
  (a) said select regions constitute the majority of the surface area of said first layer of said second material.

12. The method of claim 1, wherein:
  (a) said forming a masking layer is by photolithographic development of an organic photomask layer.

13. The method of claim 1, wherein:
  (a) said body comprises a silicon substrate under a diamond layer.

14. The method of claim 13, wherein:
  (a) said substrate is metal.

15. The method of claim 1, wherein:
  (a) a pre-masking layer is formed on a portion of said body before forming said masking layer.

16. The method of claim 15, wherein:
  (a) said pre-masking layer is silicon dioxide.

17. The method of claim 4, wherein:
  (a) said body comprises a silicon substrate under a diamond layer.

18. The method of claim 17, wherein:
  (a) said substrate is metal.

19. The method of claim 4, wherein:
  (a) a pre-masking layer is formed on a portion of said body before forming said masking layer.

20. The method of claim 19, wherein:
  (a) said pre-masking layer is silicon dioxide.

* * * * *